(12) United States Patent
Choi et al.

(10) Patent No.: US 12,380,266 B2
(45) Date of Patent: Aug. 5, 2025

(54) LAYOUT DESIGN METHOD AND METHOD OF MANUFACTURING INTEGRATED CIRCUIT DEVICE USING THE SAME

(71) Applicant: Samsung Electronics Co., Ltd., Suwon-si (KR)

(72) Inventors: Dawoon Choi, Suwon-si (KR); Inseop Lee, Suwon-si (KR); Hee Jeong, Suwon-si (KR); Bongkeun Kim, Suwon-si (KR); Myungsoo Noh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 18/370,921

(22) Filed: Sep. 21, 2023

(65) Prior Publication Data
US 2024/0104287 A1    Mar. 28, 2024

(30) Foreign Application Priority Data
Sep. 22, 2022   (KR) .................. 10-2022-0120169

(51) Int. Cl.
*G06F 30/398*   (2020.01)
*G03F 1/36*   (2012.01)
*G06F 30/392*   (2020.01)

(52) U.S. Cl.
CPC .............. *G06F 30/398* (2020.01); *G03F 1/36* (2013.01); *G06F 30/392* (2020.01)

(58) Field of Classification Search
None
See application file for complete search history.

(56) References Cited

U.S. PATENT DOCUMENTS

| | | | |
|---|---|---|---|
| 7,097,947 B2 | 8/2006 | Blöcker et al. | |
| 9,355,204 B2* | 5/2016 | Seo | G03F 1/36 |
| 10,304,934 B2 | 5/2019 | Czornomaz et al. | |
| 10,366,989 B2 | 7/2019 | Chang et al. | |
| 10,998,421 B2 | 5/2021 | Chang et al. | |
| 2013/0174112 A1* | 7/2013 | Ho | G06F 30/392 |
| | | | 716/122 |
| 2015/0040091 A1* | 2/2015 | Hamouda | G06F 30/39 |
| | | | 716/119 |
| 2020/0135869 A1* | 4/2020 | Ciou | H10D 64/254 |
| 2021/0063867 A1* | 3/2021 | Misaka | G03F 1/36 |
| 2021/0066283 A1 | 3/2021 | Kim et al. | |
| 2021/0165947 A1 | 6/2021 | Park et al. | |
| 2021/0408231 A1 | 12/2021 | Huang et al. | |
| 2022/0292245 A1* | 9/2022 | Misaka | G06F 30/392 |
| 2023/0009090 A1* | 1/2023 | Chen | H10D 84/0149 |
| 2023/0238293 A1* | 7/2023 | Sun | H01L 22/32 |
| | | | 257/48 |
| 2024/0071844 A1* | 2/2024 | Zeng | H01L 23/482 |

* cited by examiner

*Primary Examiner* — Binh X Tran
(74) *Attorney, Agent, or Firm* — Muir Patent Law, PLLC

(57) ABSTRACT

Provided is a layout design method including designing a preliminary layout including a source/drain contact pattern of an integrated circuit device, designing a first layout including a cut pattern for cutting the source/drain contact pattern, designing a second layout configured by excluding a pattern overlapping the pattern of the first layout from the preliminary layout, and correcting the preliminary layout by reflecting an etch skew based on at least one parameter of the second layout.

20 Claims, 17 Drawing Sheets

LAYOUT DESIGN METHOD AND METHOD OF MANUFACTURING INTEGRATED CIRCUIT DEVICE USING THE SAME

CROSS-REFERENCE TO RELATED APPLICATION

This application is based on and claims priority under 35 U.S.C. § 119 to Korean Patent Application No. 10-2022-0120169, filed on Sep. 22, 2022, in the Korean Intellectual Property Office, the disclosure of which is incorporated by reference herein in its entirety.

BACKGROUND

The inventive concept relates to a layout design method and a method of manufacturing an integrated circuit device using the same, and more particularly, to formation of a source/drain contact in an integrated circuit device.

Recently, down-scaling of integrated circuit devices has been made rapidly, and accordingly, the integrated circuit devices require a high operating speed as well as accuracy of an operation. Accordingly, it is necessary to develop technology for an integrated circuit device that may provide a stable insulation distance between wires and contacts in a relatively small area and improve reliability.

SUMMARY

The inventive concept provides a layout design method that may improve reliability of an integrated circuit device having a region with a reduced area according to downscaling and a method of manufacturing an integrated circuit device by using the layout design method.

In addition, objects to be achieved by the inventive concept are not limited to the objects described above, and other objects may be clearly understood by those skilled in the art from descriptions below.

The inventive concept provides a layout design method and a method of manufacturing an integrated circuit device.

According to an aspect of the inventive concept, a layout design method includes designing a preliminary layout including a source/drain contact pattern of an integrated circuit device, designing a first layout including a cut pattern for cutting the source/drain contact pattern, designing a second layout including a pattern configured by excluding a pattern overlapping the cut pattern of the first layout from the preliminary layout, and correcting the preliminary layout by reflecting an etch skew based on at least one parameter of the second layout.

According to another aspect of the inventive concept, a method of manufacturing an integrated circuit device includes designing a layout, forming a photomask by using the designed layout, and forming patterns on a substrate by using the photomask, wherein the designing of the layout comprises designing a preliminary layout including a source/drain contact pattern of the integrated circuit device, designing a first layout including a cut pattern for cutting the source/drain contact pattern, designing a second layout including a pattern configured by excluding a pattern overlapping the cut pattern of the first layout from the preliminary layout, and correcting the preliminary layout by reflecting an etch skew based on at least one parameter of the second layout.

According to another aspect of the inventive concept, a method of manufacturing an integrated circuit device includes designing a layout, forming a photomask by using the designed layout, and forming patterns on a substrate by using the photomask, wherein the designing of the layout comprises designing a preliminary layout including a source/drain contact pattern of the integrated circuit device, designing a first layout including a cut pattern for cutting the source/drain contact pattern, designing a second layout including a pattern configured by excluding a pattern overlapping the cut pattern of the first layout from the preliminary layout, correcting the preliminary layout by reflecting an etch skew based on at least one parameter of the second layout, and performing optical proximity correction (OPC) for the corrected preliminary layout, and wherein the at least one parameter includes at least one of a distance between patterns included in the second layout in a first horizontal direction and a length of each of the patterns included in the second layout in a second horizontal direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
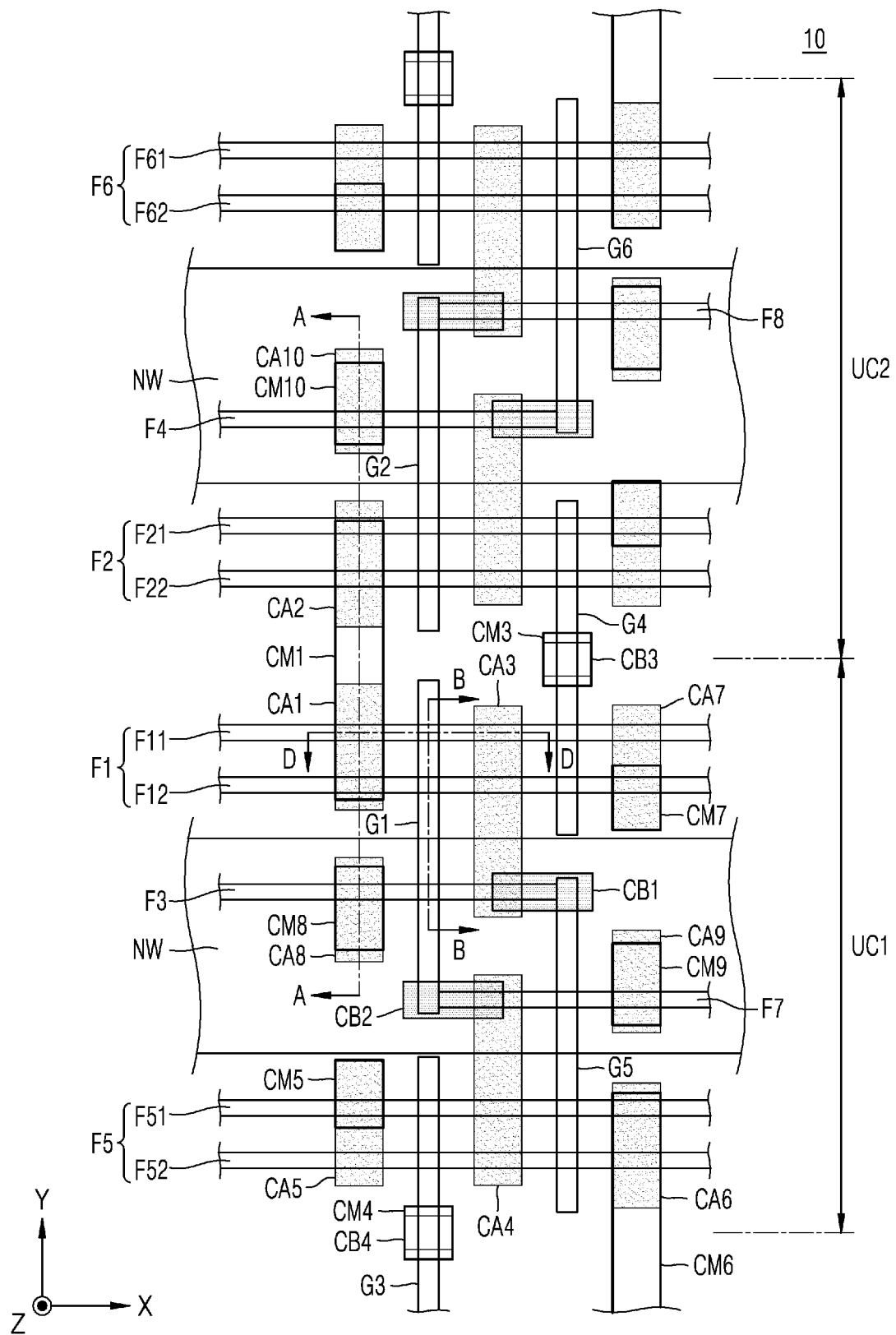
FIG. 1 is a layout diagram illustrating an integrated circuit device according to an example embodiment of the inventive concept.

Hereinafter, example embodiments of the inventive concept will be described in detail with reference to the accompanying drawings. The same reference numerals are used for the same components in the drawings, and redundant descriptions thereof are omitted.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "directly connected" or "directly coupled" to another element, or as "contacting" or "in contact with" another element (or using any form of the word "contact"), there are no intervening elements present at the point of contact.

Figure 2:
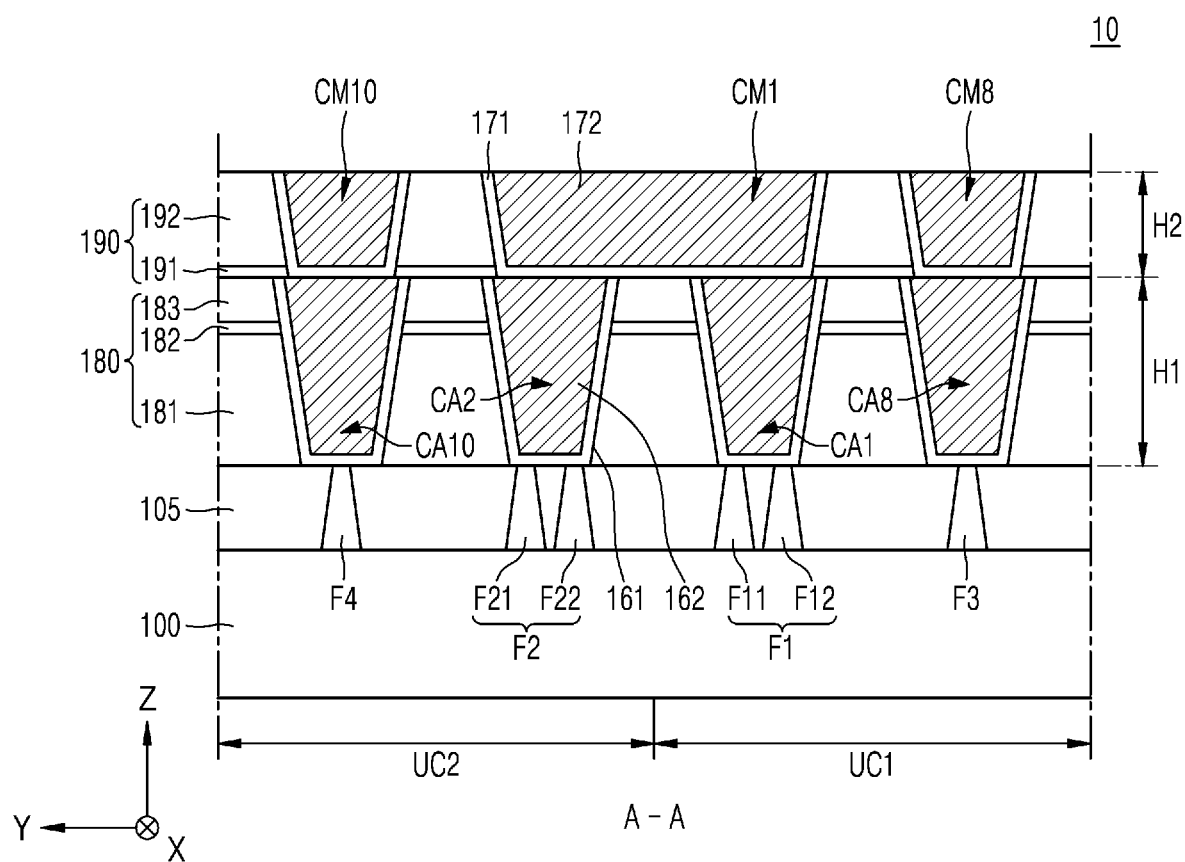
FIG. 2 is a cross-sectional view illustrating a partial configuration of a cross-section taken along line A-A of FIG. 1.
Figure 3:
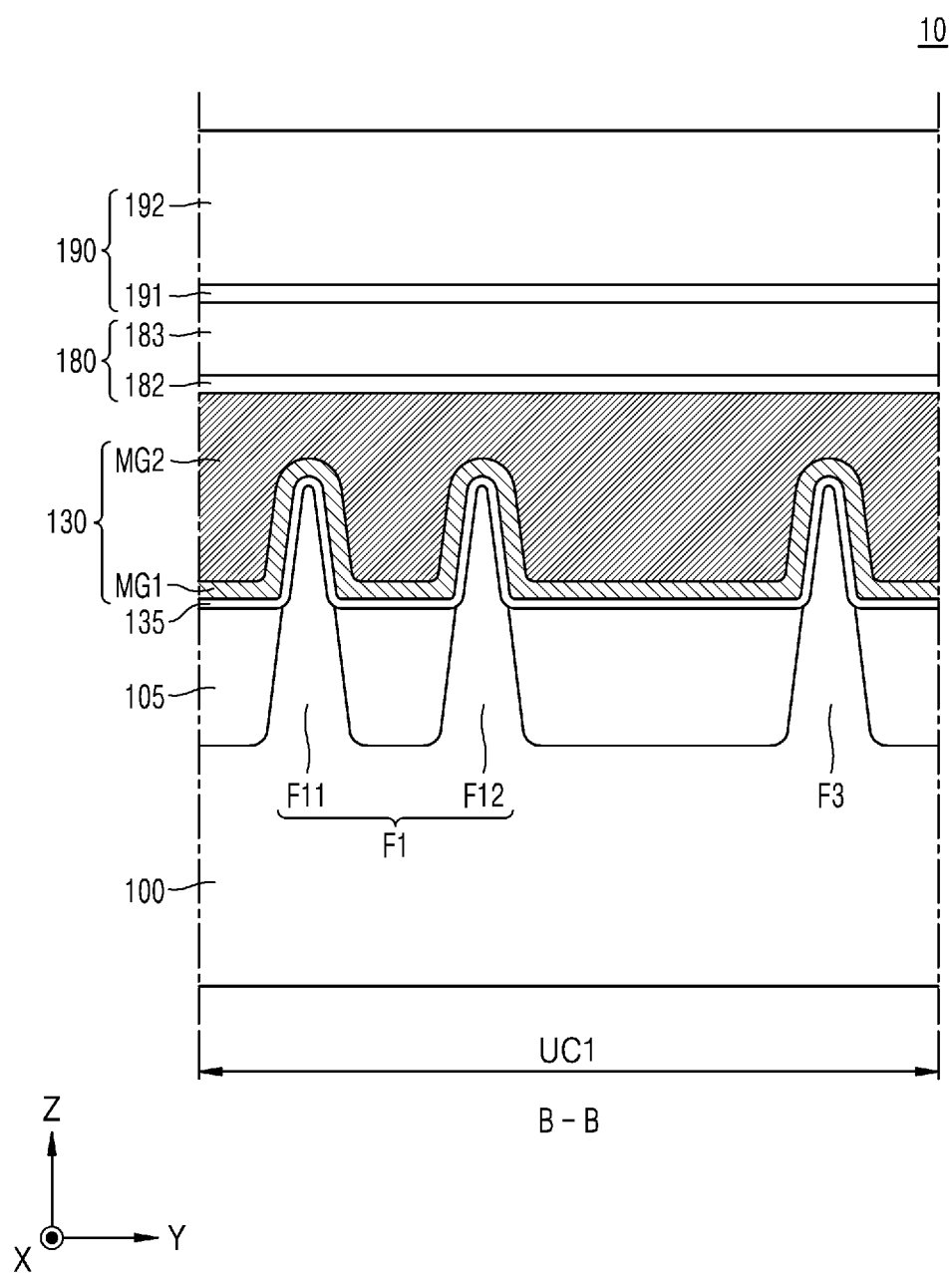
FIG. 3 is a cross-sectional view illustrating a partial configuration of a cross-section taken along line B-B of FIG. 1.
Figure 4:
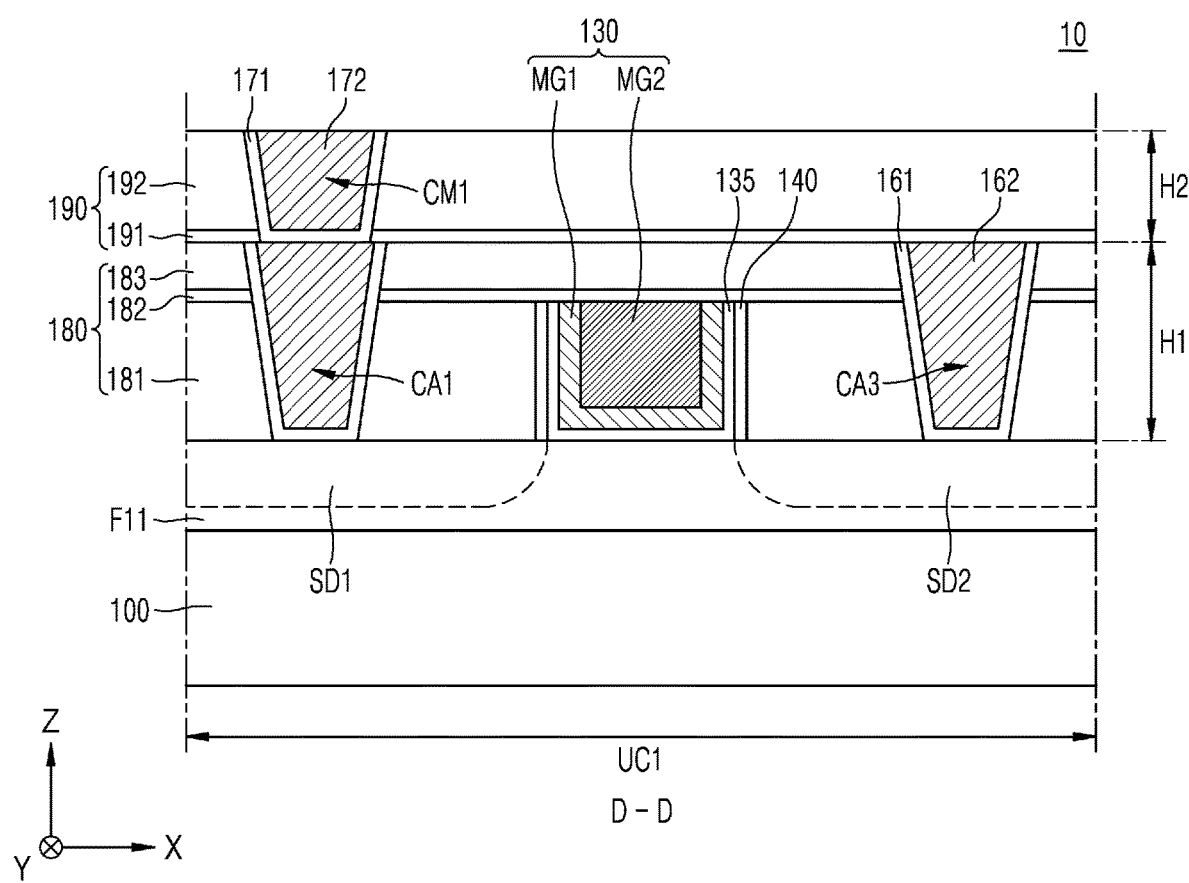
FIG. 4 is a cross-sectional view illustrating a partial configuration of a cross-section taken along line D-D of FIG. 1.

FIG. 1 is a layout diagram illustrating an integrated circuit device according to an example embodiment of the inventive concept. FIGS. 2 to 4 are cross-sectional views illustrating an integrated circuit device 10 according to example embodiments of the inventive concept, FIG. 2 is a cross-sectional view illustrating a partial configuration taken along line A-A of FIG. 1, FIG. 3 is a cross-sectional view illustrating a partial configuration taken along line B-B of FIG. 1, and FIG. 4 is a cross-sectional view illustrating a partial configuration taken along line D-D of FIG. 1.

Referring to FIGS. 1 to 4, the integrated circuit device 10 may include a plurality of fin-type active regions F1 to F8, a plurality of gate lines G1 to G6, and a plurality of source/drain contacts CA1 to CA10, a plurality of gate contacts CB1 to CB4, and a plurality of middle contacts CM1 and CM3 to CM10.

The plurality of fin-type active regions F1 to F8 may be formed on active regions of a substrate 100. The substrate 100 may have an upper surface and a lower surface opposite to the upper surface, and in the present specification, the active region of the substrate 100 may be understood as the upper surface of the substrate 100. Accordingly, the plurality of fin-type active regions F1 to F8 may be formed on the upper surface, which is the active region, of the substrate 100.

In the following drawings, an X-axis direction and a Y-axis direction represent directions parallel to the upper surface or the lower surface of the substrate 100, and the X-axis direction may be perpendicular to the Y-axis direction. A Z-axis direction may indicate a direction perpendicular to the upper surface or the lower surface of the substrate 100. That is, the Z-axis direction may be perpendicular to an X-Y plane. In addition, in the following drawings, a first horizontal direction, a second horizontal direction, and a vertical direction may be understood as follows. The first horizontal direction may be understood as the X-axis direction, the second horizontal direction may be understood as the Y-axis direction, and the vertical direction may be understood as the Z-axis direction.

The plurality of fin-type active regions F1 to F8 may extend lengthwise in the first horizontal direction X. The plurality of fin-type active regions F1 to F8 may be separated from each other in the second horizontal direction Y and may be arranged in the first horizontal direction X.

The substrate 100 may include a semiconductor, such as Si or Ge, or a compound semiconductor, such as SiGe, SiC, GaAs, InAs, or InP. The substrate 100 may include a conductive region, for example, a well doped with an impurity or a structure doped with an impurity. In some embodiments, the plurality of fin-type active regions F1 to F8 may be part of the substrate 100 (e.g., formed by etching the substrate 100) or may be formed on the substrate 100 (e.g., an epitaxial layer grown from the substrate 100). In some embodiments, the plurality of fin-type active regions F1 to F8 may be formed of a group IV compound semiconductor or a group III-V compound semiconductor.

According to example embodiments, some fin-type active regions, for example, the first fin-type active region F1, the second fin-type active region F2, the fifth fin-type active region F5, and the sixth fin-type active region F6 may each include a plurality of fin-type sub-active regions. In some embodiments, the first fin-type active region F1 may include at least two fin-type sub-active regions F11 and F12, the second fin-type active region F2 may include at least two fin-type sub-active regions F21 and F22, the fifth fin-type active region F5 may include at least two fin-type sub-active regions F51 and F52, and the sixth fin-type active region F6 may include at least two fin-type sub-active regions F61 and F62. The number of fin-type sub-active regions is described as two in the present specification but is not limited thereto, and the number of fin-type sub-active regions may be three or more.

According to example embodiments, a distance in the second horizontal direction between adjacent fin-type sub-active regions, for example, the fin-type sub-active regions F11 and F12 of the first fin-type active region F1 may be less than a distance between adjacent fin-type active regions, for example, the first fin-type active region F1 and the third fin-type active region F3.

According to example embodiments, the fin-type active regions F1, F2, F5, and F6, each including a plurality of fin-type sub-active regions, may each be used as source/drain regions of an NMOS transistor. In addition, the other fin-type active regions F3, F4, F7, and F8 may each be used as source/drain regions of a PMOS transistor.

In addition, N-type wells may be formed in regions of the substrate 100 where some of the fin-type active regions F3, F4, F7, and F8 are formed. In contrast to this, P-type wells may be formed in regions of the substrate 100 where the other fin-type active regions F1, F2, F5, and F6 are formed, but the inventive concept is not limited thereto.

The plurality of gate lines G1 to G6 may extend lengthwise in the second horizontal direction Y. In some embodiments, some gate lines G1, G2, and G3 may be on a straight line in the second horizontal direction Y, and the other gate lines G4, G5, and G6 may be on another straight line in the second horizontal direction to be separated from the straight line on which the gate lines G1, G2, and G3 are arranged in the first horizontal direction X. For example, the longitudinal axes of the gate lines G1, G2, and G3 may be aligned along the same straight line, and the longitudinal axes of the gate lines G4, G5, and G6 may be aligned along another same straight line and spaced apart from the gate lines G1, G2, and G3 in the first horizontal direction X.

In addition, the plurality of gate lines G1 to G6 may cross some regions of the fin-type active regions F1 to F8. For example, the gate line G1 may cross the fin-type active regions F1 and F3, the gate line G2 may cross the fin-type active regions F2 and F4, the gate line G3 may cross the fin-type active region F5, the gate line G4 may cross the fin-type active regions F1 and F2, the gate line G5 may cross the fin-type active regions F5 and F7, and the gate line G6 may cross the fin-type active regions F6 and F8.

The source/drain contacts CA1, CA2, CA5, CA8, and CA10 may be on a straight line extending lengthwise in the second horizontal direction Y. Other source/drain contacts CA3 and CA4 may be on another straight line extending lengthwise in the second horizontal direction Y. The other source/drain contacts CA6, CA7, and CA9 may be on another straight line extending lengthwise in the second horizontal direction Y. For example, the longitudinal axes of the source/drain contacts CA1, CA2, CA5, CA8, and CA10 may be aligned along the same straight line, the longitudinal axes of the source/drain contacts CA3 and CA4 may be aligned along another same straight line, and the longitudinal axes of the source/drain contacts CA6, CA7, and CA9 may be aligned along yet another same straight line. According to example embodiments, the source/drain contacts CA1 to CA10 may have a shape extending lengthwise in the second horizontal direction Y. The source/drain contacts CA1 to CA10 may include vias in contact with the source/drains SD1 and SD2 in the vertical direction Z.

The source/drain contacts CA1, CA3 to CA9 may be in a first unit cell UC1, and the other source/drain contacts CA2 and CA10 may be in a second unit cell UC2. Specifically, in the first unit cell UC1, the first source/drain contact CA1 may be in contact with the first fin-type active region F1. The third source/drain contact CA3 may be in contact with the first fin-type active region F1 and the third fin-type active region F3. The fourth source/drain contact CA4 may be in contact with the fifth fin-type active region F5 and the seventh fin-type active region F7. The fifth source/drain contact CA5 may be in contact with the fifth fin-type active region F5, and the sixth source/drain contact CA6 may be in contact with the fifth fin-type active region F5. The seventh source/drain contact CA7 may be in contact with the first fin-type active region F1, the eighth source/drain contact CA8 may be in contact with the third fin-type active region F3, and the ninth source/drain contact CA9 may be in contact with the seventh fin-type active region F7.

In addition, in the second unit cell UC2, the second source/drain contact CA2 may be in contact with the second fin-type active region F2, and the tenth source/drain contact CA10 may be in contact with the fourth fin-type active region F4.

The gate contacts CB1 to CB4 may be in contact with the gates in the vertical direction to be electrically connected to the gates.

The first gate contact CB1 may be on the fifth gate line G5. In particular, the first gate contact CB1 may also be on the third fin-type active region F3 and may also be in contact with the third source/drain contact CA3. For example, the fifth gate line G5 may be electrically connected to parts of the first fin-type active region F1 and the third fin-type active region F3 through the first gate contact CB1 and the third source/drain contact CA3.

The second gate contact CB2 may be on the first gate line G1. In particular, the second gate contact CB2 may also be on the seventh fin-type active region F7 and may also be in contact with the fourth source/drain contact CA4. For example, the first gate line G1 may be electrically connected to parts of the seventh fin-type active region F7 and the fifth fin-type active region F5 through the second gate contact CB2 and the fourth source/drain contact CA4.

The third gate contact CB3 may be on the fourth gate line G4 to be electrically connected to a word line. The fourth gate contact CB4 may be on the third gate line G3 to be electrically connected to the word line.

The plurality of middle contacts CM1 and CM3 to CM10 may be on the plurality of source/drain contacts CA1 to CA10 and CB1 to CB4. According to example embodiments, the first middle contact CM1 may be in direct contact with the first source/drain contact CA1 and the second source/drain contact CA2 to electrically connect the first source/drain contact CA1 to the second source/drain contact CA2. For example, the middle contacts CM1 and CM3 to CM10 may be used to route peripheral gate contacts and/or source/drain contacts to each other.

The middle contacts CM1 and CM3 to CM10 may be a different concept from a wiring structure (that is, a wiring structure including vias and/or general wires). The middle contacts CM1 and CM3 to CM10 may have a wire shape extending long in one direction without including vias. Lengths of the middle contacts CM1 and CM3 to CM10 may be relatively small compared to lengths of general wires. According to example embodiments, the middle contacts CM1 and CM3 to CM10 may be formed at the same level as each other in the vertical direction Z. In cross section, a height H1 of each of the plurality of source/drain contacts CA1 to CA10 and CB1 to CB4 is greater than a height H2 of the middle contacts CM1 and CM3 to CM10.

In addition, some of the middle contacts CM1, CM5, CM8, and CM10 may be on a straight line extending lengthwise in the second horizontal direction Y. The other middle contacts CM6, CM7, and CM9 may be on another straight line extending lengthwise in the second horizontal direction Y. For example, the longitudinal axes of the middle contacts CM1, CM5, CM8, and CM10 may be aligned along the same straight line, and the longitudinal axes of the middle contacts CM6, CM7, and CM9 may be aligned along another same straight line.

The middle contact CM1 may be on the adjacent source/drain contacts CA1 and CA2 to electrically connect the adjacent source/drain contacts CA1 and CA2 to each other.

Referring to FIGS. 2 and 3, a field insulating layer 105 may be formed on the substrate 100. The field insulating layer 105 may fill at least a part of a trench region between adjacent fin-type active regions F1 to F8 and between adjacent fin-type sub-active regions (e.g., between fin-type sub-active regions F11 and F12 and between fin-type sub-active regions F21 and F22). The field insulating layer 105 may include one of, for example, an oxide layer, a nitride layer, an oxynitride layer, and a combination thereof. The field insulating layer 105 may be in partial contact with the plurality of fin-type active regions F1 to F8. According to example embodiments, at least parts of the fin-type active regions F1 to F8 may protrude upward above an upper surface of the field insulating layer 105 in the vertical direction Z.

Referring to FIGS. 3 and 4, a gate line 130 may be formed on the field insulating layer 105. The gate line 130 may include two or more stacked metal layers MG1 and MG2. The first metal layer MG1 may adjust a work function, and the second metal layer MG2 may fill a space formed by the first metal layer MG1. According to example embodiments, the first metal layer MG1 may include at least one of TiN, WN, TiAl, TiAlN, TiAlC, TaN, TiC, TaC, TaCN, and TaSiN, or a combination thereof. The second metal layer MG2 may include at least one of W, Al, Cu, Co, Ti, Ta, poly-Si, SiGe, and a metal alloy. The gate line 130 may be formed through, for example, a replacement process or a gate last process but is not limited thereto.

The gate line 130 is described by taking a drawing including a cross-section of the gate line G1 as an example in the present specification but is not limited to the cross-section of the gate line G1, and the gate line 130 may indicate any one of the plurality of gate lines G1 to G6 illustrated in FIG. 1.

A gate insulating layer 135 may be formed between the fin-type active regions F1 to F8 and the gate lines G1 to G6. According to example embodiments, the gate insulating layer 135 may be formed along profiles of the fin-type active regions F1 to F8 protruding above the field insulating layer 105. For example, the gate insulating layer 135 may be formed along the profile of the first fin-type active region F1 and the profile of the third fin-type active region F3. In addition, the gate insulating layer 135 may be formed between the gate line 130 and the field insulating layer 105. The gate insulating layer 135 may contact upper surfaces of the fin-type active regions F1 to F8 and lower surfaces of the gate lines G1 to G6.

The gate insulating layer 135 may be formed of a silicon oxide, a silicon oxynitride, a silicon nitride, or a material with a higher dielectric constant than the silicon oxide. A high-dielectric material may include at least one of, for example, hafnium oxide, hafnium silicon oxide, lanthanum oxide, lanthanum aluminum oxide, zirconium oxide, zirconium silicon oxide (zirconium silicon oxide), tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

A spacer 140 (see FIG. 4) may be formed on a sidewall of the gate line 130. For example, the spacer 140 may contact the sidewall of the gate line 130. The spacer 140 may include at least one of, for example, a silicon nitride (SiN), a silicon oxynitride (SiON), a silicon oxide (SiO$_2$), a silicon oxycarbonitride (SiOCN), and a combination thereof.

The source/drains SD1 and SD2 may be formed on both sides of the gate line 130. The sources/drains SD1 and SD2 may be formed in each of the plurality of fin-type active regions F1 to F8. The source/drain contacts (for example, CA1 and CA3) may be respectively in direct contact with the source/drains SD1 and SD2 on the source/drains SD1 and SD2.

Lower surfaces of the source/drain contacts CA1 and CA3 and a lower surface of the gate line 130 are illustrated in FIG. 4 to be at substantially the same level in the vertical direction Z but are not limited thereto, and the source/drain contacts CA1 and CA3 may be formed deeper in the fin-type active region F11 such that the lower surfaces of the source/drain contacts CA1 and CA3 are at a lower level than the lower surface of the gate line 130 in the vertical direction Z.

A first interlayer insulating layer 180 may be formed on the field insulating layer 105. The first interlayer insulating layer 180 may cover the plurality of fin-type active regions F1 to F8. The first interlayer insulating layer 180 may cover the gate line 130.

The first interlayer insulating film 180 may include a first insulating layer 181, an interlayer liner layer 182, and a second insulating layer 183 sequentially formed on the field insulating film 105 in the vertical direction Z. The first insulating layer 181 may cover sidewalls of the gate line 130. For example, the first insulating layer 181 may contact sidewalls of the gate line 130. The interlayer liner layer 182 and the second insulating layer 183 may be formed on the gate line 130. More specifically, the interlayer liner layer 182 may be formed along an upper surface of the gate line 130. For example, a lower surface of the interlayer liner layer 182 may contact an upper surface of the second metal layer MG2 of the gate line 130. Each of the first insulating layer 181, the interlayer liner layer 182, and the second insulating layer 183 may contact side surfaces of the plurality of source/drain contacts CA1 to CA10. The first insulating layer 181 and the second insulating layer 183 may be separated from each other in the vertical direction Z with the interlayer liner layer 182 therebetween. A lower surface of the interlayer liner layer 182 may contact an upper surface of the first insulating layer 181, and an upper surface of the interlayer liner layer 182 may contact a lower surface of the second insulating layer 183.

The first insulating layer 181 and the second insulating layer 183 may each include at least one of, for example, a silicon oxide, a silicon nitride, a silicon oxynitride, and a low-dielectric material having a lower dielectric constant than the silicon oxide. The low-dielectric material may include, for example, fluorinated tetraethyl orthosilicate (FTEOS), hydrogen silsesquioxane (HSQ), bis-benzocyclobutene (BCB), tetramethyl orthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), silk, amorphous fluorinated carbon, silica aerogels, silica xerogels, mesoporous silica, or a combination thereof, but is not limited thereto.

The interlayer liner layer 182 may include a material different from materials of, for example, the first insulating layer 181 and the second insulating layer 183. The interlayer liner layer 182 may include, for example, silicon nitride (SiN) but is not limited thereto.

The plurality of source/drain contacts CA1 to CA10 and the plurality of gate contacts CB1 to CB4 may be formed in the first interlayer insulating layer 180. The plurality of source/drain contacts CA1 to CA10 and the plurality of gate contacts CB1 to CB4 may penetrate, for example, the second insulating layer 183, the interlayer liner layer 182, and the first insulating layer 181.

The plurality of source/drain contacts CA1 to CA10 and the plurality of gate contacts CB1 to CB4 may each include a first barrier layer 161 and a first filling layer 162. The first barrier layer 161 may be formed along a contact hole formed in the first interlayer insulating layer 180. The first filling layer 162 may fill the contact hole in which the first barrier layer 161 is formed. The first filling layer 162 may be formed on the first barrier layer 161. The first filling layer 162 may contact the first barrier layer 161. Upper surfaces of the first barrier layer 161 and the first filling layer 162 may be coplanar with an upper surface of the second insulating layer 183.

A second interlayer insulating layer 190 may include a first etch stop layer 191 and a third insulating layer 192.

The first etch stop layer 191 may be formed on the second insulating layer 183. For example, a lower surface of the first etch stop layer 191 may contact an upper surface of the second insulating layer 183. The first etch stop layer 191 may include at least one of, for example, a silicon nitride (SiN), a silicon oxynitride (SiON), a silicon carbonitride (SiCN), and a silicon oxycarbide (SiCO).

The third insulating layer 192 may be on the first etch stop layer 191. For example, a lower surface of the third insulating layer 192 may contact an upper surface of the first etch stop layer 191. The third insulating layer 192 may include at least one of, for example, a silicon oxide, a silicon nitride, a silicon oxynitride, and a low-k material.

Each of the plurality of middle contacts CM1 and CM3 to CM10 may include a second barrier layer 171 and a second filling layer 172. The second barrier layer 171 may be formed along a contact hole formed in the second interlayer insulating layer 190. The second filling layer 172 may fill the contact hole in which the second barrier layer 171 is formed. The second filling layer 172 may be formed on the second barrier layer 171. The second filling layer 172 may contact the second barrier layer 171. Upper surface of the second barrier layer 171 and the second filling layer 172 may be coplanar with an upper surface of the third insulating layer 192.

The first barrier layer 161 and the second barrier layer 171 may each include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh).

The first filling layer 162 and the second filling layer 172 may each include at least one of, for example, copper (Cu), aluminum (Al), tungsten (W), cobalt (Co), ruthenium (Ru), and molybdenum (Mo).

The first fin-type active region F1 may be in contact with the source/drain contact CA1 and the second fin-type active region F2 may be in contact with the source/drain contact CA2. The middle contact CM1 may be on the adjacent source/drain contacts CA1 and CA2 to connect the adjacent source/drain contacts CA1 and CA2 to each other. For example, the middle contact CM1 may contact both of the adjacent source/drain contacts CA1 and CA2. The middle contact CM1 and the source/drain contacts CA1 and CA2 are electrically connected to a first voltage (for example, the ground voltage VSS).

Figure 5:
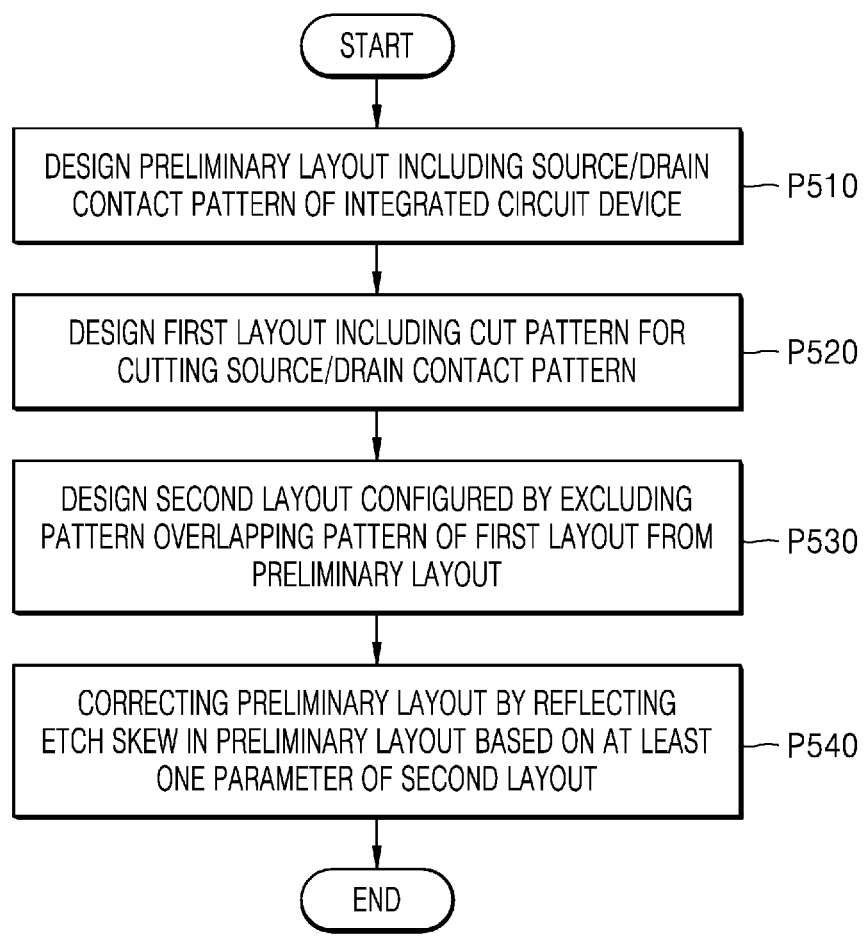
FIG. 5 is a flowchart illustrating a layout design method according to an example embodiment of the inventive concept.
Figure 6:
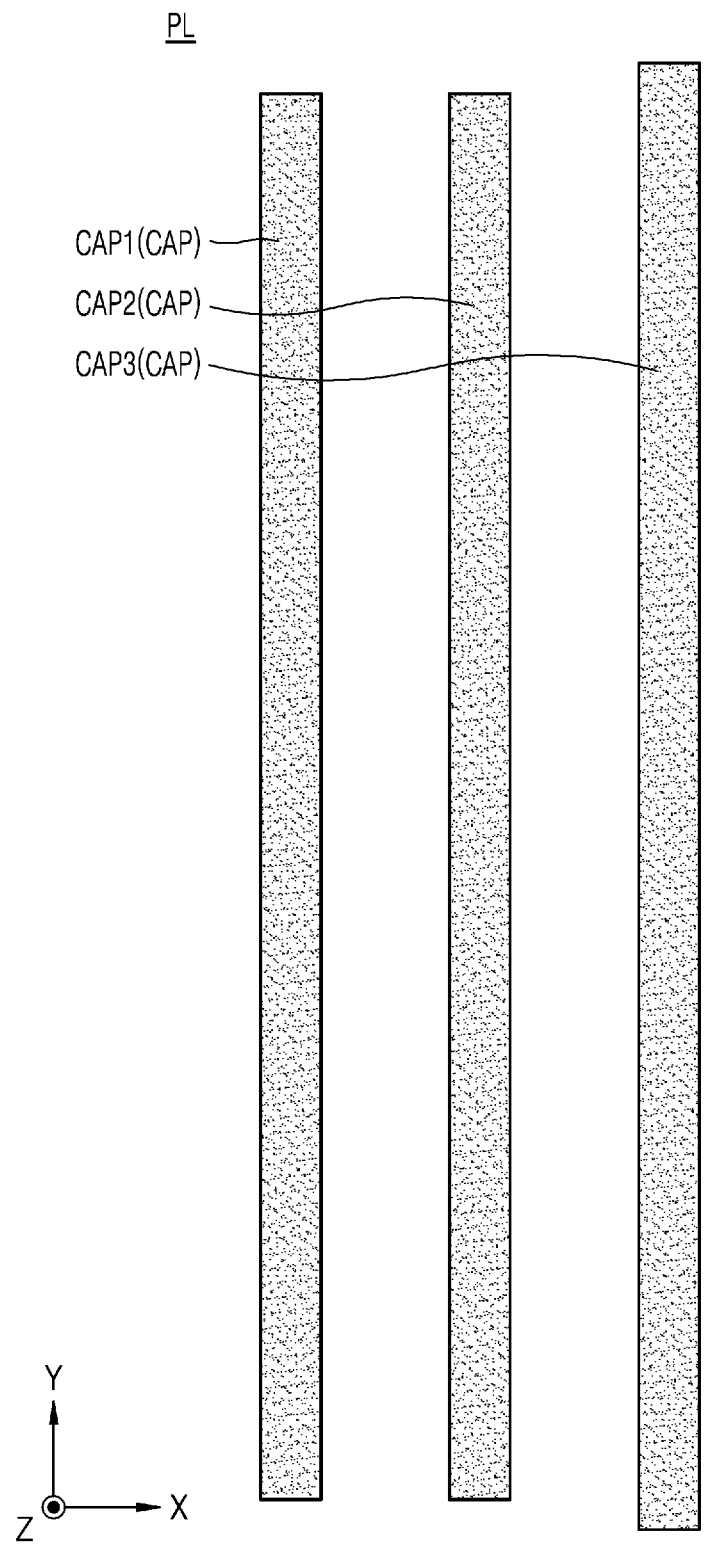
FIG. 6 is a planar preliminary layout diagram illustrating a source/drain contact pattern of an integrated circuit device according to an example embodiment of the inventive concept.
Figure 7:
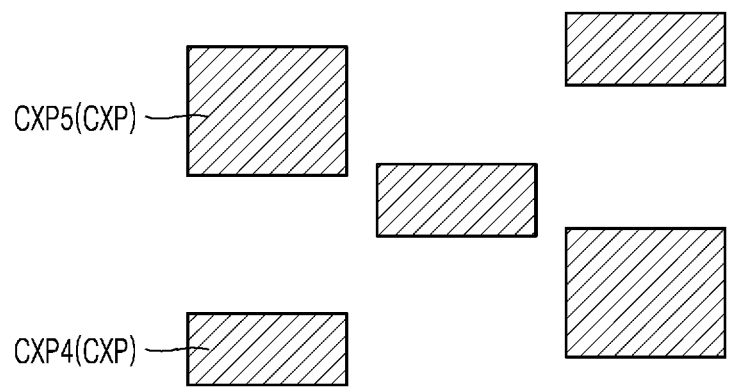
FIG. 7 is a planar first layout diagram illustrating a cut pattern of an integrated circuit device according to an example embodiment of the inventive concept.
Figure 7:
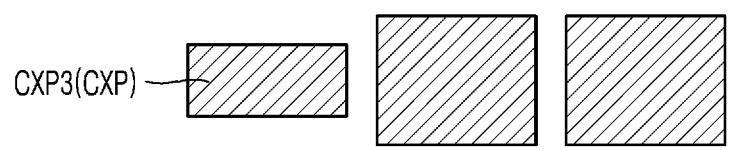
Figure 7:
Figure 7:
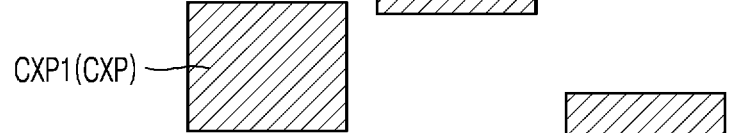
Figure 7:
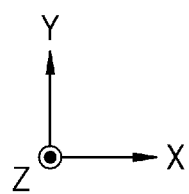
Figure 8:
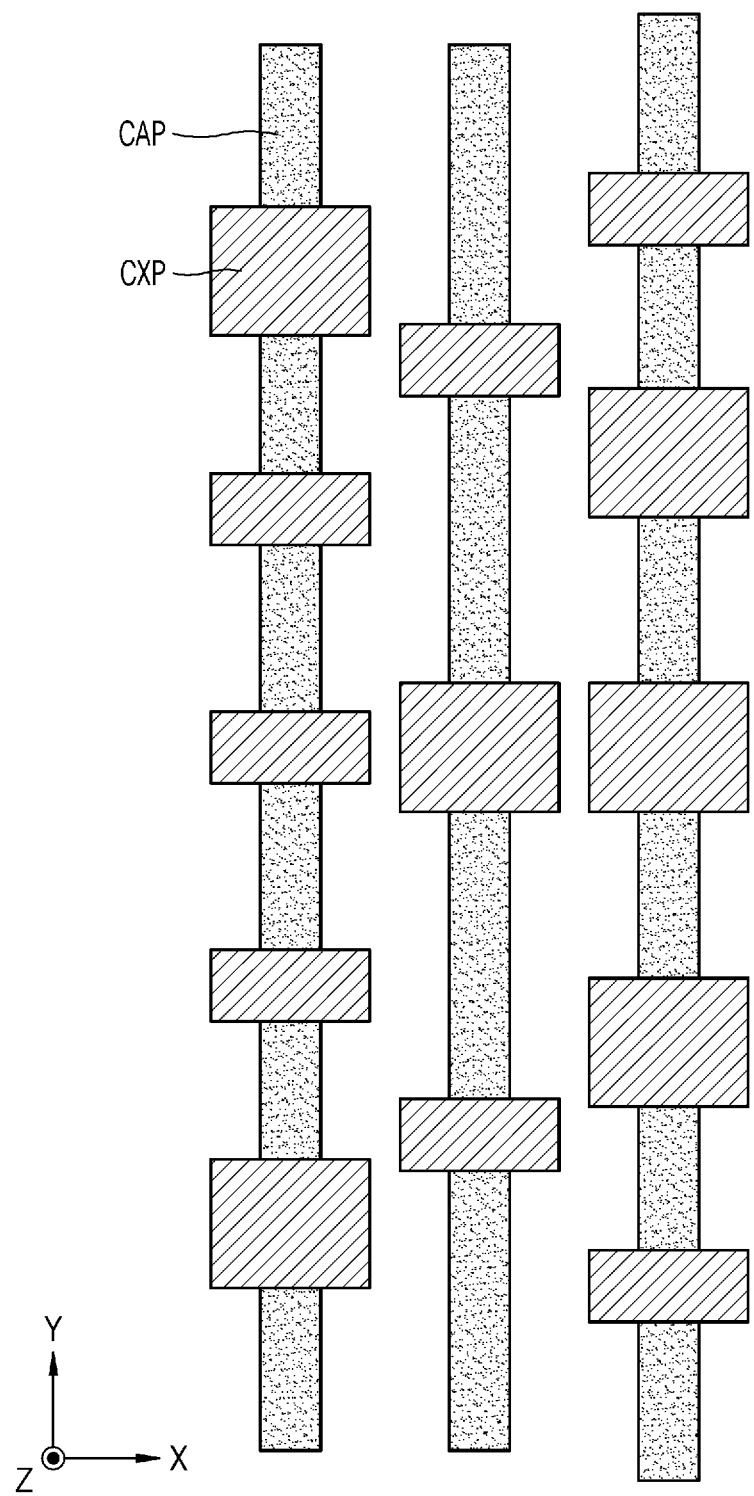
FIG. 8 is a schematic view illustrating a source/drain contact according to an example embodiment of the inventive concept.
Figure 9:
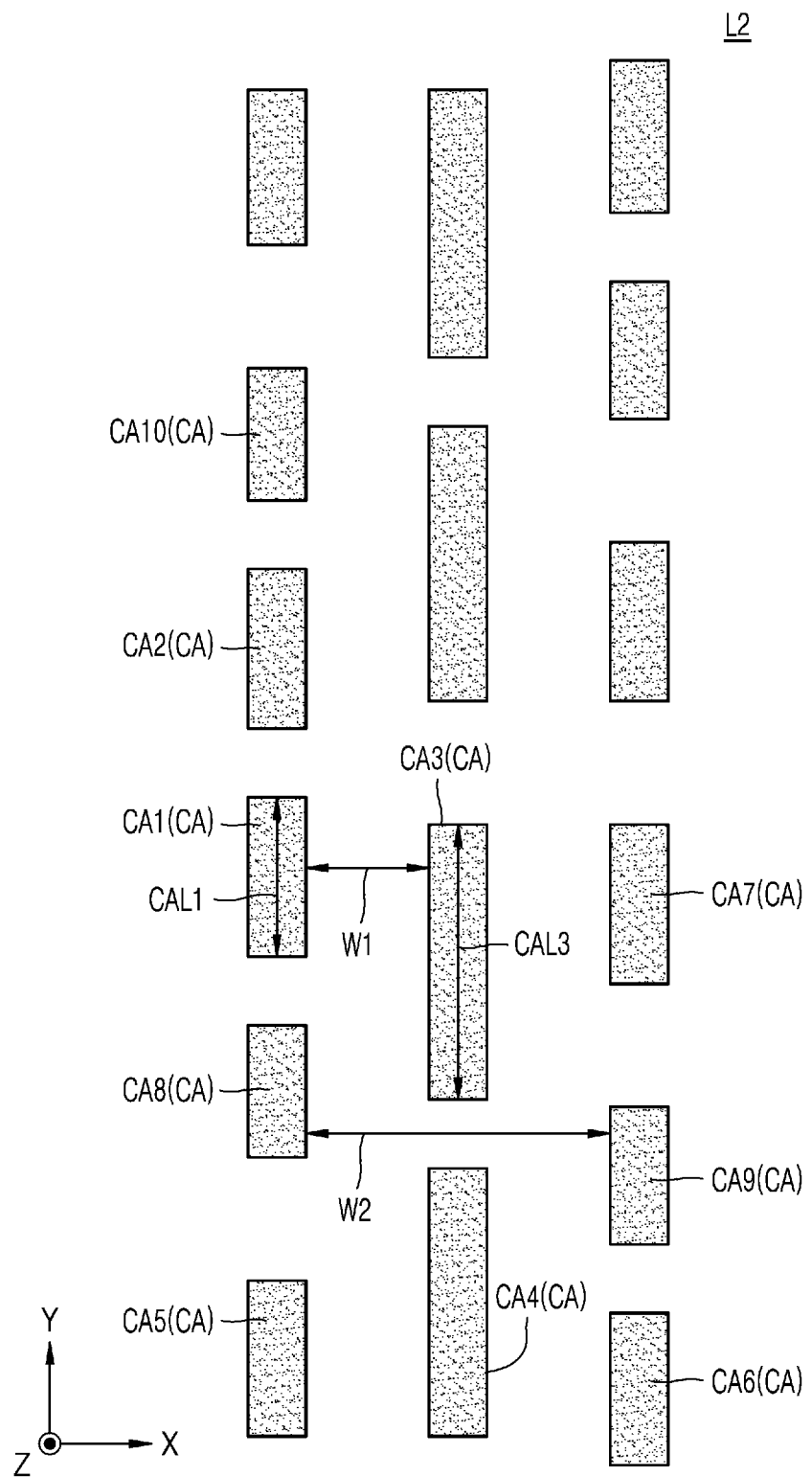
FIG. 9 is a second layout diagram illustrating a plurality of source/drain contacts according to an example embodiment of the inventive concept.

FIG. 5 is a flowchart illustrating a layout design method according to an example embodiment of the inventive concept. FIG. 6 is a preliminary layout diagram illustrating source/drain contact patterns of an integrated circuit device according to an example embodiment of the inventive concept. FIG. 7 is a first layout diagram illustrating cut patterns of the integrated circuit device according to an example embodiment of the inventive concept. FIG. 8 is a schematic view illustrating source/drain contacts according to an example embodiment of the inventive concept. FIG. 9 is a second layout diagram illustrating a plurality of source/drain contacts according to an example embodiment of the inventive concept.

Referring to FIGS. 5 to 9, the layout design method may include a process sequence of first to fourth operations P510 to P540.

When embodiments are otherwise implementable, a certain process sequence may also be performed differently from the sequence to be described. For example, two processes to be described in succession may be performed substantially simultaneously or may be performed in an order reverse to the order to be described.

A layout design method according to an example embodiment of the inventive concept may include operation P510 of designing a preliminary layout including source/drain contact patterns of an integrated circuit device, operation P520 of designing a first layout including a cut pattern for cutting a source/drain contact pattern, operation P530 of designing a second layout configured by excluding a pattern overlapping a pattern of the first layout from the preliminary layout, and operation P540 of correcting the preliminary layout by reflecting an etch skew in the preliminary layout based on at least one parameter of the second layout.

Referring to FIGS. 5 to 9, a preliminary layout PL for forming source/drain contacts may be designed in operation P510. In the present specification, the preliminary layout PL may be understood as a layout of source/drain contact patterns CAP primarily formed on an integrated circuit device. In addition, a first layout L1 may also indicate a layout of a cut pattern CXP formed on the integrated circuit device. The second layout L2 may indicate a layout of the source/drain contact CA finally formed on the integrated circuit device.

According to example embodiments, the source/drain contact pattern CAP may include a first source/drain contact pattern CAP1, a second source/drain contact pattern CAP2, and a third source/drain contact pattern CAP3.

The first to third source/drain contact patterns CAP1 to CAP3 may each have a shape extending lengthwise in the second horizontal direction Y, and the first to third source/drain contact patterns CAP1 to CAP3 may each have an integral shape without being cut in the middle thereof. According to example embodiments, a length in the second horizontal direction Y of each of the first to third source/drain contact patterns CAP1 to CAP3 may be greater than lengths in the second horizontal direction Y of the plurality of source/drain contacts CA1 to CA10 described with reference to FIG. 1.

According to some embodiments, the source/drain contact pattern CAP may be formed on a mask to correspond to a source/drain contact pattern primarily formed on an integrated circuit device. In some embodiments, a mask pattern, on which an exposure process is performed, may be formed through a lithography process. In some embodiments, the mask pattern may be formed through a process using extreme ultraviolet rays. In some embodiments, a mask on which the source/drain contact pattern CAP is formed may be a hard mask, but is not limited thereto.

Referring to FIGS. 5, 7, and 8, in operation P520, the first layout L1 including the cut pattern CXP for cutting the source/drain contact pattern CAP may be designed. The cut pattern CXP may include a plurality of patterns extending in the first horizontal direction X. The cut pattern CXP may partially overlap the source/drain contact patterns CAP described with reference to FIG. 6 in the X-Y plane. For example, the cut pattern CXP may partially overlap the source/drain contact patterns CAP in the X-Y plane.

According to example embodiments, the cut pattern CXP may be a layout of a cut pattern formed on an integrated circuit device, but is not limited thereto. In some embodiments, the cut pattern CXP may be formed on a mask corresponding to a cut pattern formed on an integrated circuit device. The cut patterns CXP may be in the second horizontal direction Y along each of the source/drain contact patterns CAP1 to CAP3. The cut pattern CXP may be formed to separate, in the second horizontal direction Y, each of the source/drain contact patterns CAP1 to CAP3 extending in the second horizontal direction Y and having an integral shape. For example, the source/drain contact patterns CAP1 to CAP3 may be cut in the second horizontal direction Y by the cut pattern CXP. According to example embodiments, an oxide layer may be deposited along the cut pattern CXP.

Referring to FIGS. 5, 8, and 9, in operation P530, a process of designing the second layout L2 configured by excluding a pattern overlapping a pattern of the first layout L1 from the preliminary layout PL may be performed.

The second layout L2 may be a layout of the source/drain contacts CA finally formed on the integrated circuit device. The second layout L2 may include a pattern excluding a pattern overlapping the cut pattern CXP of the first layout L1 in the X-Y plane from the source/drain contact pattern CAP of the preliminary layout PL. As illustrated in FIG. 8, when the preliminary layout PL overlaps the first layout L1 in the X-Y plane, a pattern in which the source/drain contact pattern CAP overlaps the cut pattern CXP may be formed. Here, a pattern as illustrated in FIG. 9 may be formed by excluding the overlapping patterns based on the preliminary layout PL. For example, when patterns overlapping the first cut pattern CXP1, the second cut pattern CXP2, and the third cut pattern CXP3 are excluded from the first source/drain contact pattern CAP1 of the preliminary layout PL, a pattern corresponding to the first source/drain contact CA1 and a pattern corresponding to the second source/drain contact CA2 may be formed. For example, a pattern corresponding to the source/drain contact CA to be actually formed may be formed on the integrated circuit device through operation P530. The pattern may have a similar aspect ratio to an aspect ratio of the source/drain contact CA to be actually formed on the integrated circuit device.

The following parameters may be provided to the second layout L2 in which the source/drain contact pattern CAP is cut by the cut pattern CXP.

The second layout L2 may include a length of the plurality of source/drain contacts CA formed in the second layout L2 in the second horizontal direction Y, a distance in the direction X between the plurality of source/drain contacts CA formed in the second layout L2, and so on. For example, a length CAL1 of the first source/drain contact CA1 in the second horizontal direction Y, and a length CAL3 of the third source/drain contact CA3 in the second horizontal direction Y may be provided, and a distance W1 in the first horizontal direction X between the first source/drain contact CA1 and the third source/drain contact CA3, and a distance W2 in the first horizontal direction X between the eighth source/drain contact CA8 and the ninth source/drain contacts CA9 may be provided. As illustrated in FIG. 9, the length CAL1 may be less than the length CAL3, and the distance W1 may be less than the distance W2.

Figure 10A:
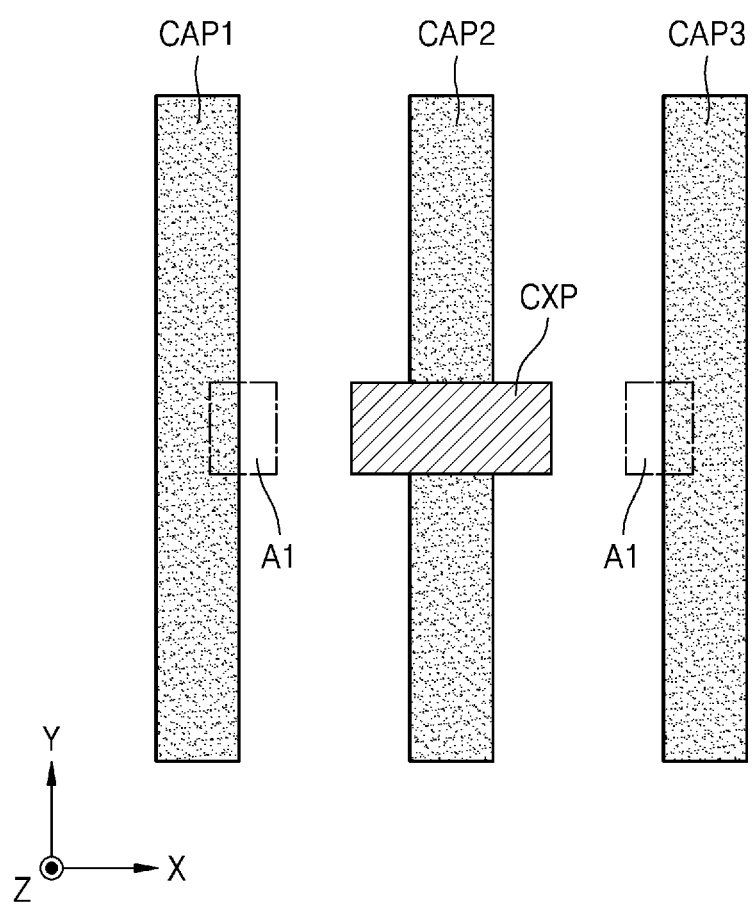
FIGS. 10A to 10C are schematic views illustrating preliminary layout correction according to an example embodiment of the inventive concept.
Figure 10B:
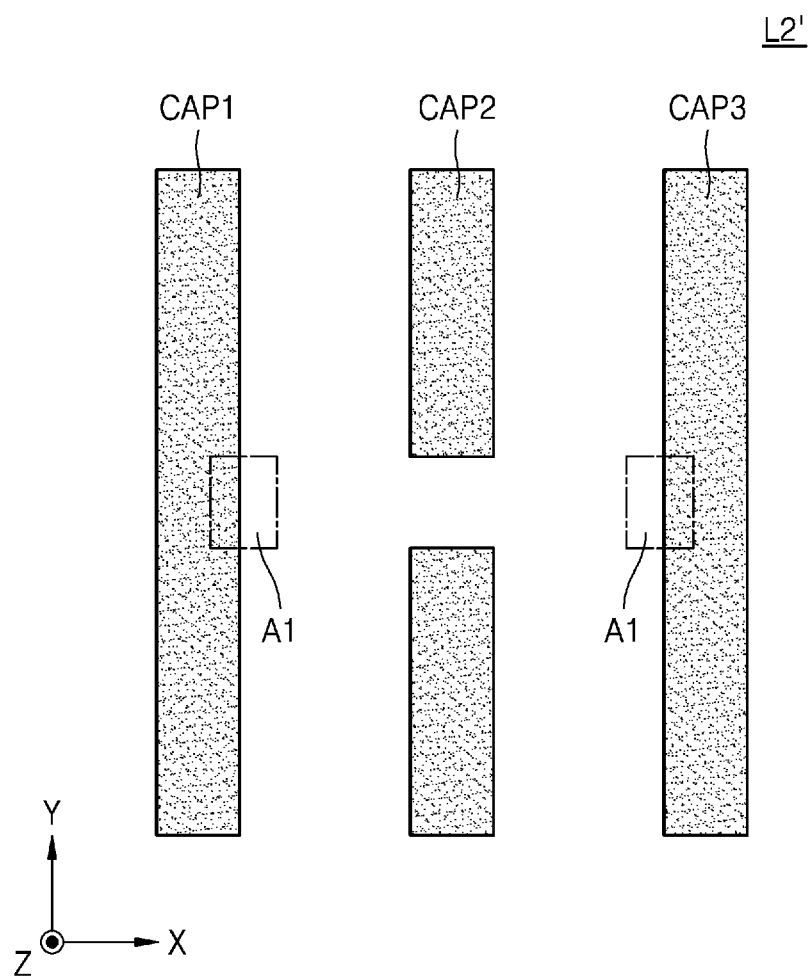
Figure 10C:
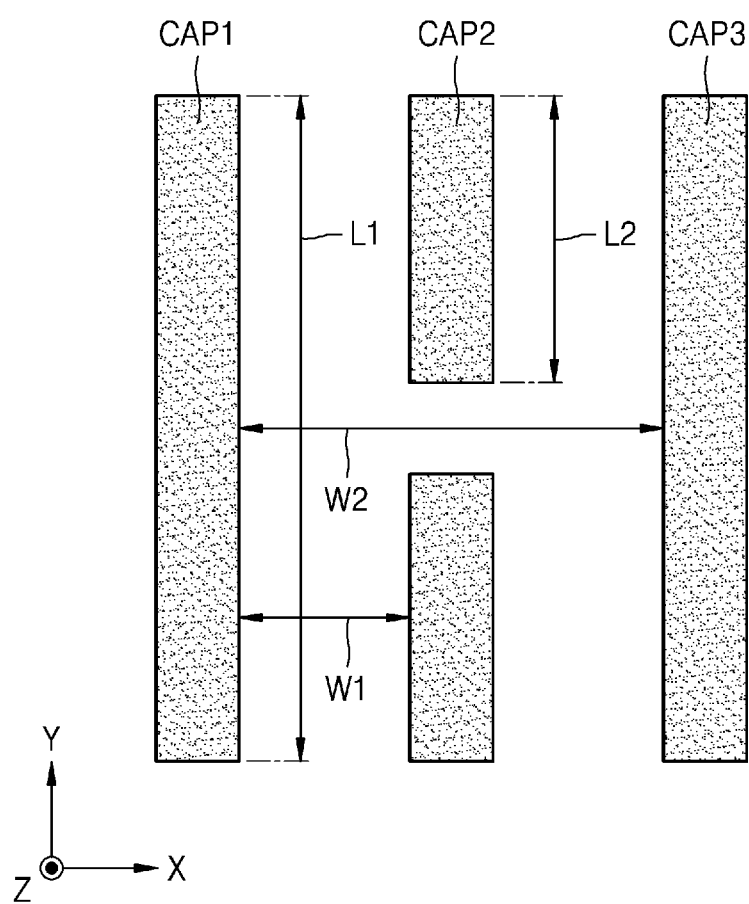
Figure 11:
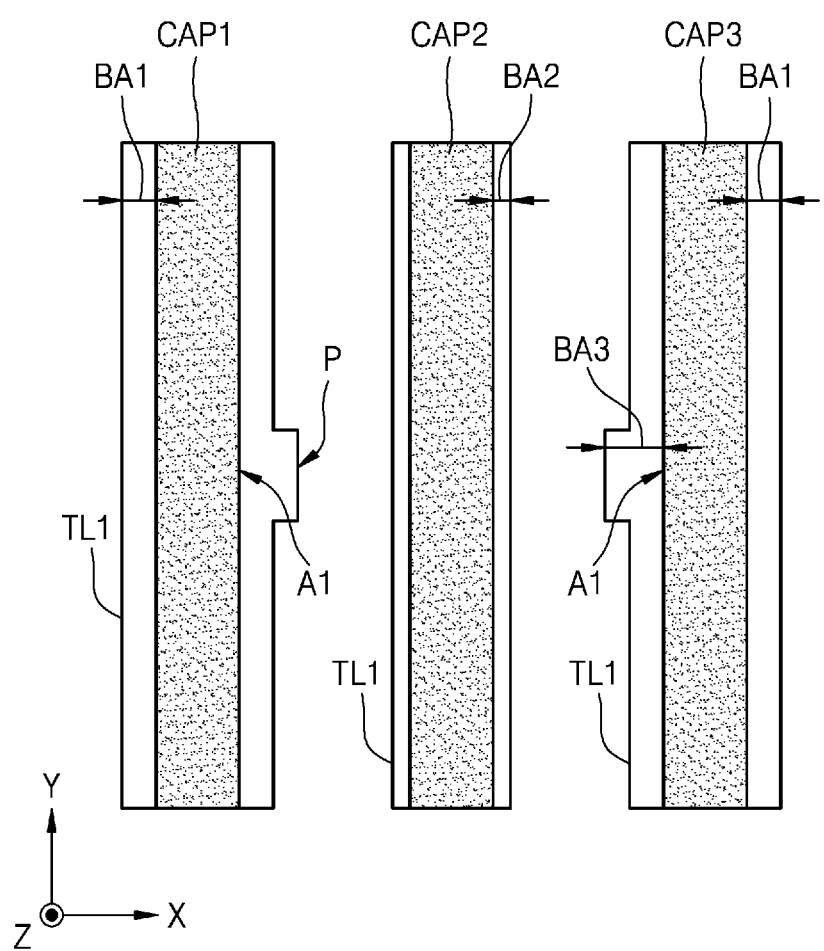
FIG. 11 is a schematic view illustrating a target layout according to an example embodiment of the inventive concept.
Figure 12:
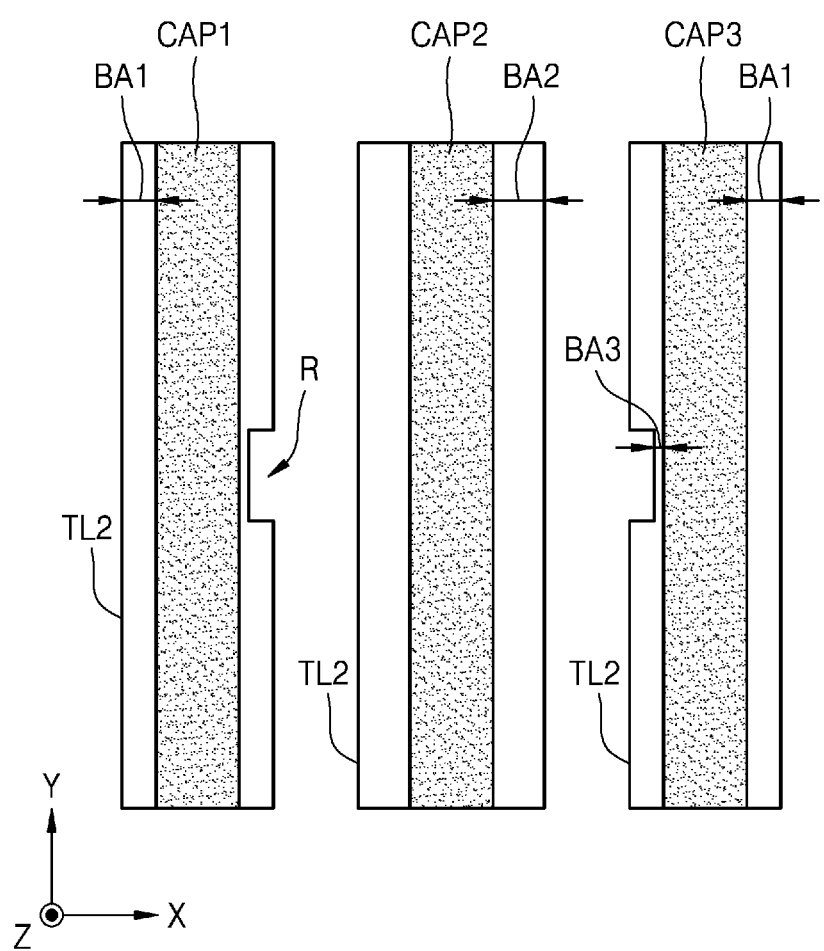
FIG. 12 is a schematic view illustrating another target layout according to an example embodiment of the inventive concept.

FIGS. 10A to 10C are schematic views illustrating preliminary layout correction according to example embodiments of the inventive concept. FIG. 11 is a schematic view illustrating a target layout according to an example embodiment of the inventive concept. FIG. 12 is a schematic view illustrating another target layout according to an example embodiment of the inventive concept.

The target layout may indicate a layout of a pattern actually formed on a mask. For example, the target layout may be a layout of a pattern formed on a mask to form the source/drain contacts CA. A second layout L2' illustrated in FIG. 10B is to describe a process of forming a target layout according to the inventive concept and may not be compatible with the second layout L2 illustrated in FIG. 9.

Referring to FIGS. 5 and 10A to 12, a process of correcting the preliminary layout PL by reflecting an etch skew in the preliminary layout PL based on at least one parameter of the second layout L2' may be performed in operation P540.

The etch skew may indicate a parameter difference, for example, a critical dimension difference between a pattern to be formed on a substrate and a pattern formed on a mask or a photoresist to form the pattern. Layout correction may mean correction of a pattern in a layout. In some embodiments, the correction may include correction for providing a bias to the preliminary layout PL. The bias may indicate a change in shape and position of a pattern in a layout. Accordingly, providing the bias may be understood as making a change to a shape and a position of a pattern in the known layout.

According to example embodiments, as illustrated in FIG. 10A, the source/drain contact patterns CAP1, CAP2, and CAP3 may overlap the cut pattern CXP in the X-Y plane. Although only one cut pattern CXP is illustrated in FIG. 10A, this is to describe correction of the preliminary layout PL, and a plurality of cut patterns CXP may be provided as illustrated in FIGS. 7 and 8, and each of the source/drain contact pattern CAP and the cut pattern CXP illustrated in FIGS. 10A to 10C may have a different shape from a shape of each of the source/drain contact pattern CAP and the cut pattern CXP illustrated in FIGS. 6 to 9.

According to example embodiments, the cut pattern CXP may overlap the second source/drain contact pattern CAP2 in the vertical direction Z. In this case, the cut pattern CXP may be separated in the first horizontal direction X from a side surface of the first source/drain contact pattern CAP1 and a side surface of the third source/drain contact pattern CAP3.

The first source/drain contact pattern CAP1 and the third source/drain contact pattern CAP3 may respectively include first regions Al facing the cut pattern CXP in the first horizontal direction X. For example, the first regions Al may be an area facing the cut pattern CXP on each side of the first source/drain contact pattern CAP1 and the third source/drain contact pattern CAP3.

A region of the second source/drain contact pattern CAP2 in which the cut pattern CXP overlaps the second source/drain contact pattern CAP2 in the X-Y plane may not be formed finally on the substrate. The shape illustrated in FIG. 10B may be formed finally on the substrate, and in this case, the first region Al of the first source/drain contact pattern CAP1 may face the first region Al of the third source/drain contact pattern CAP3. For example, the second source/drain contact pattern CAP2 is divided into two in the second horizontal direction Y by the cut pattern CXP, and accordingly, the first region Al of the first source/drain contact pattern CAP1 may face the first region Al of the third source/drain contact pattern CAP3.

Accordingly, as illustrated in FIG. 10C, the distance W2 in the first horizontal direction X between the first region Al of the first source/drain contact pattern CAP1 and the first region Al of the third source/drain contact pattern CAP3 may be greater than the distance W1 in the first horizontal direction X between the first source/drain contact pattern CAP1 and the second source/drain contact pattern CAP2.

In addition, as described above, the second source/drain contact pattern CAP2 is divided into two in the second horizontal direction Y by the cut pattern CXP, and accordingly, a length L2 of a pattern located at an upper portion among the divided second source/drain contact patterns CAP2 in the second horizontal direction Y may be less than a length L1 of the first source/drain contact pattern CAP1 in the second horizontal direction Y.

As a result, the second layout L2' may have various parameter values due to the cut pattern CXP.

Non-uniform pattern loading may occur in a pattern formed on an integrated circuit due to various layout parameters. According to example embodiments, in the source/drain contact pattern CAP, as a length of the source/drain contact pattern CAP in the second horizontal direction Y is reduced, a critical dimension of a pattern formed on an actual integrated circuit device may increase. Accordingly, when the length of the source/drain contact pattern CAP in the second horizontal direction Y is reduced, a target layout, which provides a relatively small bias to the preliminary layout, may be formed. In contrast to this, when the length of the source/drain contact pattern CAP in the second horizontal direction Y is increased, the critical dimension of the pattern formed on the actual integrated circuit device may be reduced. Accordingly, a target layout, which provides a relatively large amount of bias to the preliminary layout, may be formed.

In addition, as a distance in the first horizontal direction X between adjacent source/drain contact patterns CAP in the first horizontal direction X is reduced, the source/drain contact patterns CAP may obtain larger critical dimensions. Accordingly, as the distance between adjacent source/drain contact patterns CAP in the first horizontal direction X is reduced, a target layout which provides a relatively small bias to the preliminary layout may be formed. In contrast to this, when the distance in the first horizontal direction X between adjacent source/drain contact patterns CAP in the first horizontal direction X is increased, a smaller critical dimension may be obtained. Accordingly, a target layout which provides a relatively large amount of bias to the preliminary layout may be formed.

However, tendency of critical dimensions of the lengths of the source/drain contact patterns CAP described above in the second horizontal direction Y and the distance between the source/drain contact patterns CAP in the first horizontal direction X is just one example and may have the opposite tendency.

In addition, a positive bias may indicate a case in which a layout is corrected by increasing a width, a shape, and so on of the known pattern of the preliminary layout PL, and a negative bias may indicate a case in which a layout is corrected by reducing a width, a shape, and so on of the known pattern of the preliminary layout PL. In this case, the bias may be reduced when parameters are relatively small regardless of the positive bias or the negative bias, and the bias may increase when the parameters are relatively large.

The preliminary layout PL may be corrected based on the parameter values and tendency of the parameter values. Referring to FIGS. 11 and 12, a bias BA2 provided to the second source/drain contact pattern CAP2 may be less than a bias BA1 provided to the first and third source/drain contact patterns CAP1 and CAP3. This is because the second source/drain contact pattern CAP2 is divided into an upper pattern and a lower pattern by the cut pattern CXP causing lengths in the second horizontal direction Y to be reduced.

In addition, in the first regions Al of the first source/drain contact pattern CAP1 and the third source/drain contact pattern CAP3, the distance between the source/drain contact patterns CAP in the first horizontal direction X is relatively large as described with reference to FIG. 10C, and accordingly, a greater bias may be provided to the first areas Al in the preliminary layout PL. For example, a bias BA3 provided in the first region Al may be greater than the bias BA1 described above. In this case, FIG. 11 illustrates a case in which a positive bias is applied, and a protrusion P may be formed in the first region Al. A target layout TL1 may be formed by the biases BA1, BA2, and BA3.

In contrast to this, FIG. 12 illustrates a case in which a negative bias is applied, and a large bias is provided in the first region Al as before, but there may be a difference in that a recess R is formed in the first region Al. In addition, the bias BA1 is less than the bias BA2 due to the negative bias, and a target layout TL2 may be formed.

As a result, based on a parameter according to a shape of the second layout L2, a small bias may be provided to some regions of the preliminary layout PL, and a large bias may be provided to the other regions of the preliminary layout PL. Accordingly, in the layout design method according to the inventive concept, a target layout TL may be formed by correcting the preliminary layout PL based on the parameters of the second layout L2.

According to example embodiments, an optical proximity correction (OPC) process may be additionally performed after the target layout TL is formed. The OPC process may implement layout patterns obtained through the layout design on a silicon substrate by using a photolithography process. In this case, OPC may be a technique for correcting distortion that may occur in the photolithography process. For example, refraction due to characteristics of light during exposure using a laid-out pattern or distortion of process effects may be corrected by the OPC. While performing the OPC, shapes and positions of patterns in the designed layout may be changed.

Figure 13:
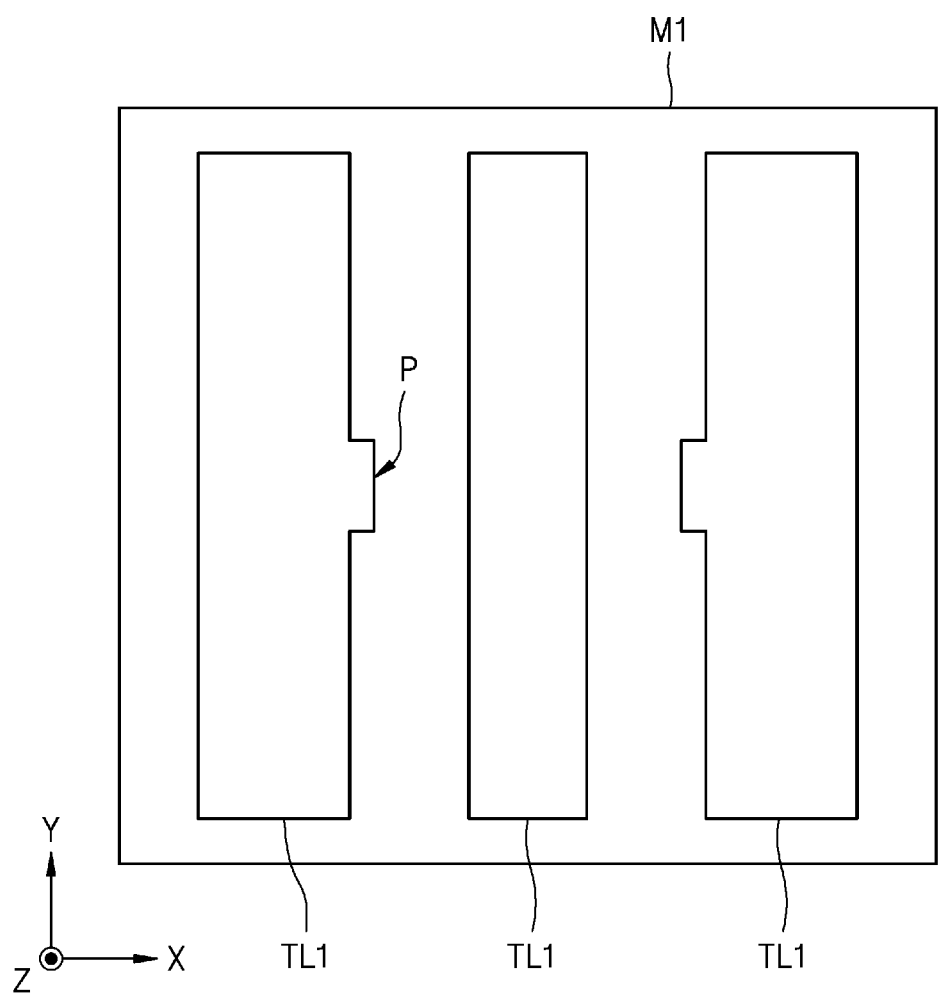
FIGS. 13 and 14 are schematic views illustrating a first mask according to an example embodiment of the inventive concept.
Figure 14:
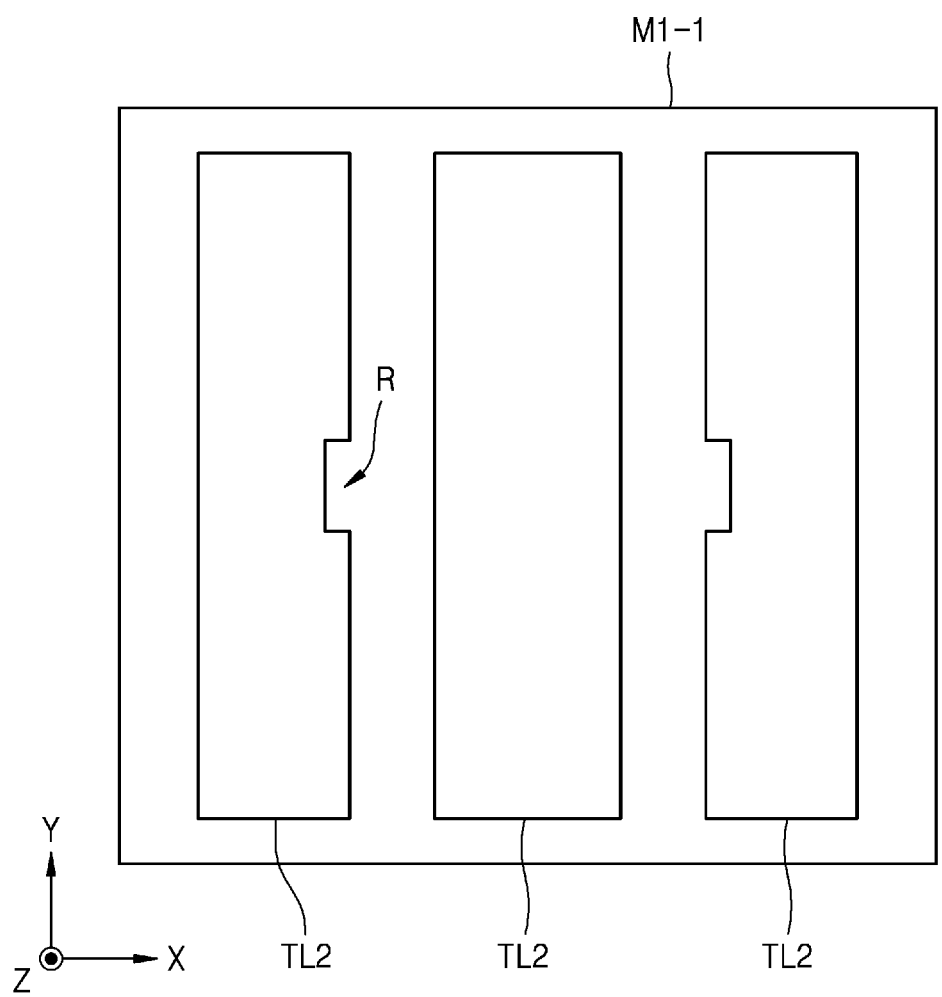

FIGS. 13 and 14 are schematic views illustrating a first mask according to example embodiments of the inventive concept. Target layouts TL1 and TL2 illustrated in FIGS. 13 and 14 may be substantially the same as or similar to the target layouts TL1 and TL2 described with reference to FIGS. 10A to 12, and thus, descriptions thereof are omitted.

Referring to FIGS. 13 and 14, a first mask M1 illustrated in FIG. 13 may have the target layout TL1 described with reference to FIGS. 10A to 11. The first mask M1 may be used to form a pattern on an integrated circuit. According to example embodiments, source/drain contact patterns may be primarily formed on an integrated circuit device through the first mask M1.

In addition, a first mask M1-1 illustrated in FIG. 14 may have the target layout TL2 described with reference to FIGS. 10A to 10C and FIG. 12. The first mask M1-1 may be used to form a pattern on an integrated circuit. According to example embodiments, source/drain contact patterns may be primarily formed on an integrated circuit device through the first mask M1-1.

In some embodiments, the first masks M1 and M1-1 may be used to form a photoresist pattern.

Figure 15:
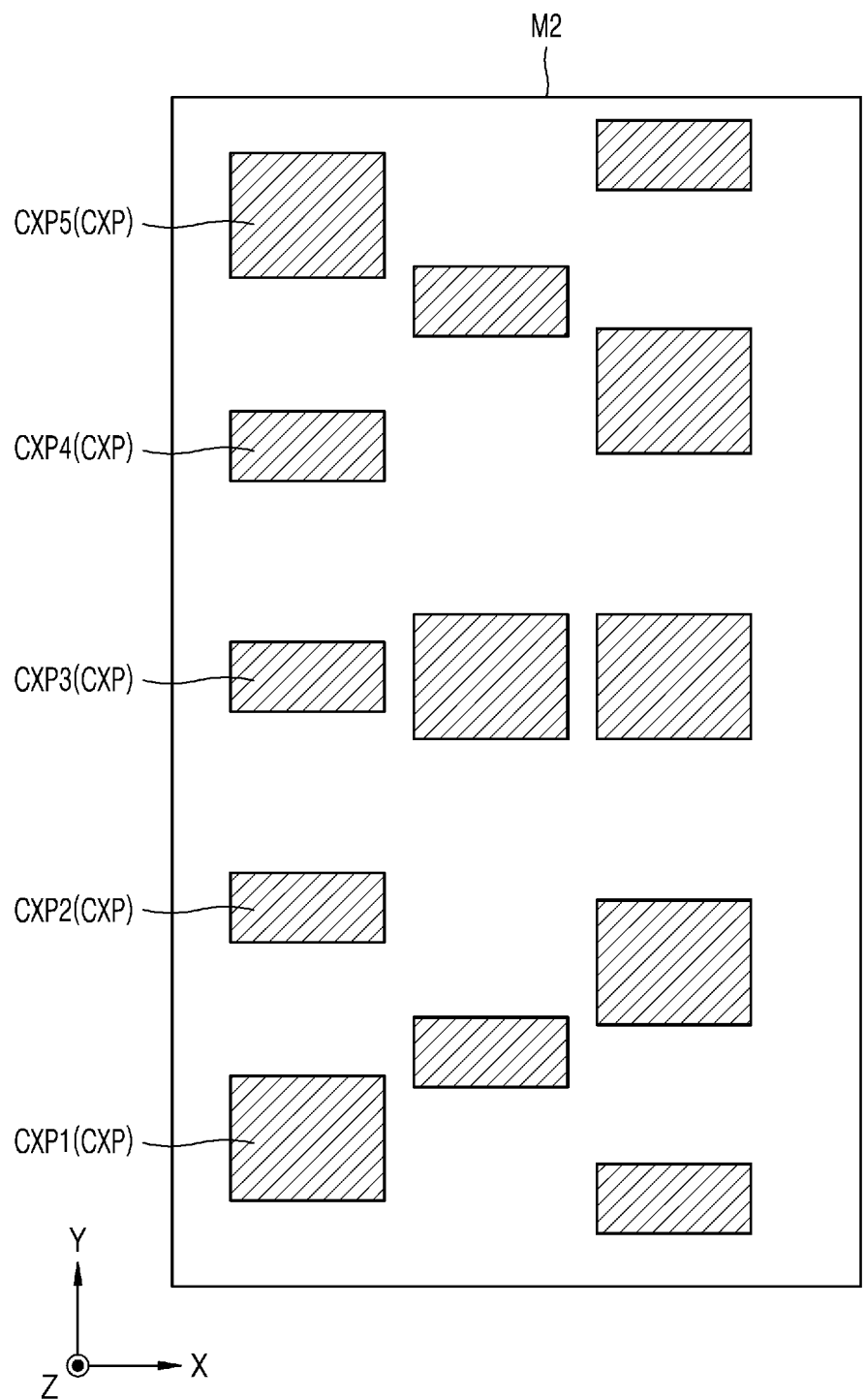
FIG. 15 is a schematic view illustrating a second mask according to an example embodiment of the inventive concept.

FIG. 15 is a schematic view illustrating a second mask according to an example embodiment of the inventive concept.

Referring to FIG. 15, a second mask M2 may have the first layout L1 illustrated in FIG. 7. The second mask M2 may be used to form a pattern on an integrated circuit. According to example embodiments, cut patterns CXP may be formed on an integrated circuit device through the second mask M2. For example, the source/drain contact patterns primarily formed on the integrated circuit may be divided into a plurality of pieces in the second horizontal direction Y through the second mask M2.

While the inventive concept has been particularly illustrated and described with reference to embodiments thereof, it will be understood that various changes in form and details may be made therein without departing from the spirit and scope of the following claims.

What is claimed is:

1. A layout design method comprising:
   designing a preliminary layout including a source/drain contact pattern of an integrated circuit device;
   designing a first layout including a cut pattern for cutting the source/drain contact pattern;
   designing a second layout including a pattern configured by excluding a pattern overlapping the cut pattern of the first layout from the preliminary layout; and
   correcting the preliminary layout by reflecting an etch skew based on at least one parameter of the second layout.

2. The layout design method of claim 1, wherein the at least one parameter includes a distance in a first horizontal direction between patterns included in the second layout.

3. The layout design method of claim 2, wherein, in the correcting of the preliminary layout, as the distance in the first horizontal direction between patterns of the second layout increases, a greater bias is provided to the preliminary layout.

4. The layout design method of claim 1, wherein the at least one parameter includes a length in a second horizontal direction of the pattern included in the second layout.

5. The layout design method of claim 4, wherein, in correcting of the preliminary layout, as the length of the pattern of the second layout in the second horizontal direction increases, a greater bias is provided to the preliminary layout.

6. The layout design method of claim 1, wherein the correcting of the preliminary layout comprises:
   extracting a first region facing the cut pattern of the first layout in a first horizontal direction in the source/drain contact pattern of the preliminary layout; and
   providing a greater bias to the first region of the source/drain contact pattern.

7. The layout design method of claim 6, wherein the greater bias is a positive bias.

8. The layout design method of claim 6, wherein the greater bias is negative bias.

9. The layout design method of claim 1, wherein a target layout is formed by the correcting of the preliminary layout.

10. The layout design method of claim 9, further comprising:
    performing optical proximity correction (OPC) for the target layout.

11. A method of manufacturing an integrated circuit device, the method comprising:
    designing a layout;
    forming a photomask by using the designed layout; and
    forming patterns on a substrate by using the photomask, wherein the designing of the layout comprises:
       designing a preliminary layout including a source/drain contact pattern of the integrated circuit device;
       designing a first layout including a cut pattern for cutting the source/drain contact pattern;
       designing a second layout including a pattern configured by excluding a pattern overlapping the cut pattern of the first layout from the preliminary layout; and
       correcting the preliminary layout by reflecting an etch skew based on at least one parameter of the second layout.

12. The method of claim 11, wherein the correcting of the preliminary layout comprises:
    extracting a first region facing the cut pattern of the first layout in a first horizontal direction in the source/drain contact pattern of the preliminary layout; and
    providing a greater bias to the first region of the source/drain contact pattern.

13. The method of claim 11,
    wherein the at least one parameter includes a distance in a first horizontal direction between patterns included in the second layout, and
    wherein in the correcting of the preliminary layout, as the distance in the first horizontal direction between the patterns of the second layout increases, a greater bias is provided to the preliminary layout.

14. The method of claim 11,
    wherein the at least one parameter includes a length in a second horizontal direction of patterns included in the second layout, and
    wherein in correcting of the preliminary layout, as the length of the patterns of the second layout in the second horizontal direction increases, a greater bias is provided to the preliminary layout.

15. The method of claim 11, wherein a target layout is formed by the correcting of the preliminary layout.

16. The method of claim 15, wherein the target layout includes a protrusion in a first horizontal direction from a side surface of the source/drain contact pattern.

17. The method of claim 15, wherein the target layout includes a recess formed in a side surface of the source/drain contact pattern.

18. A method of manufacturing an integrated circuit device, the method comprising:
    designing a layout;
    forming a photomask by using the designed layout; and
    forming patterns on a substrate by using the photomask, wherein the designing of the layout comprises:
       designing a preliminary layout including a source/drain contact pattern of the integrated circuit device;
       designing a first layout including a cut pattern for cutting the source/drain contact pattern;
       designing a second layout configured by excluding a pattern overlapping the cut pattern of the first layout from the preliminary layout;
       correcting the preliminary layout by reflecting an etch skew based on at least one parameter of the second layout; and
       performing optical proximity correction (OPC) for the corrected preliminary layout, and
    wherein the at least one parameter includes at least one of a distance between patterns included in the second layout in a first horizontal direction and a length of each of the patterns included in the second layout in a second horizontal direction.

19. The method of claim 18, wherein the correcting of the preliminary layout comprises:

extracting a first region facing the cut pattern of the first layout in a first horizontal direction in the source/drain contact pattern of the preliminary layout; and providing a greater bias to the first region of the source/drain contact pattern.

20. The method of claim 19, wherein the greater bias is a positive bias.

* * * * *